(12) United States Patent
Hsu et al.

(10) Patent No.: US 7,439,154 B2
(45) Date of Patent: Oct. 21, 2008

(54) METHOD OF FABRICATING INTERCONNECT STRUCTURE

(75) Inventors: Feng-Yu Hsu, Tainan Hsien (TW); Chih-Chien Liu, Taipei (TW); Jim-Jey Huang, Tainan County (TW); Jei-Ming Chen, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 168 days.

(21) Appl. No.: 11/565,632

(22) Filed: Dec. 1, 2006

(65) Prior Publication Data

US 2007/0093053 A1  Apr. 26, 2007

Related U.S. Application Data

(62) Division of application No. 11/163,285, filed on Oct. 13, 2005, now abandoned.

(51) Int. Cl.
*H01L 21/00* (2006.01)
*H01L 21/44* (2006.01)

(52) U.S. Cl. ............... 438/424; 438/393; 438/624; 438/761; 257/E21.26; 257/E21.271

(58) Field of Classification Search ................. 438/393, 438/424, 624, 761; 257/E21.26, E21.271
See application file for complete search history.

(56) References Cited

U.S. PATENT DOCUMENTS

| 4,724,021 | A | * | 2/1988 | Martin et al. | ............ 156/89.14 |
|---|---|---|---|---|---|
| 5,116,271 | A | * | 5/1992 | Arimoto | ...................... 445/24 |
| 5,260,163 | A | * | 11/1993 | Nebe et al. | ................... 430/198 |
| 6,753,218 | B2 | * | 6/2004 | Devoe et al. | ................ 438/240 |
| 7,291,567 | B2 | * | 11/2007 | Tsuchiya et al. | ............ 438/761 |
| 7,342,315 | B2 | * | 3/2008 | Tsui et al. | .................... 257/758 |
| 7,361,992 | B2 | * | 4/2008 | Matsubara et al. | .......... 257/758 |
| 2007/0066028 | A1 | * | 3/2007 | Beyer | .......................... 438/424 |

\* cited by examiner

*Primary Examiner*—Michael S Lebentritt
(74) *Attorney, Agent, or Firm*—Jianq Chyun IP Office (57) ABSTRACT

A method for fabricating an interconnect structure is described. A substrate with a conductive part thereon is provided, a first porous low-k layer is formed on the substrate, and then a first UV-curing step is conducted. A damascene structure is formed in the first porous low-k layer to electrically connect with the conductive part, and then a first UV-absorption layer is formed on the first porous low-k layer and the damascene structure. A second porous low-k layer is formed on the first UV-absorption layer, and a second UV-curing step is conducted.

9 Claims, 8 Drawing Sheets

METHOD OF FABRICATING INTERCONNECT STRUCTURE

CROSS-REFERENCE TO RELATED APPLICATION

This is a divisional application of patent application Ser. No. 11/163,285, filed on Oct. 13, 2005. The entirety of the above-mentioned patent application is hereby incorporated by reference herein and made a part of this specification.

BACKGROUND OF THE INVENTION

1. Field of the Invention

The present invention relates to a method of fabricating an integrated circuit structure. More particularly, the present invention relates to a method of fabricating an interconnect structure.

2. Description of the Related Art

With the rapid reduction in dimension of IC device, the line pitch of interconnect is decreased unceasingly. Because the RC delay effect gets more significant at reduced line pitch, $SiO_2$ with a dielectric constant near 4.0 cannot be used as an IMD material in the interconnect structure. Therefore, low-k materials are widely used instead of $SiO_2$ to reduce the parasitic capacitance, so as to inhibit the RC delay effect and the cross-talking effect and improve the operation speed.

One of current low-k materials is porous low-k material, which can be treated with UV-curing to improve the physical properties thereof, including modulus, hardness and adhesivity, etc. Since an interconnect structure usually includes multiple dielectric layers, multiple cycles of UV curing must be conducted. However, because the porous low-k layers are transparent to UV light, the UV light can pierce the portions of the porous low-k layers not screened by the interconnect structures. Therefore, a lower porous low-k layer is cured more times and receives more UV-irradiation than an upper one, so that the physical properties of the porous low-k layers are not uniform.

Figure 1A:
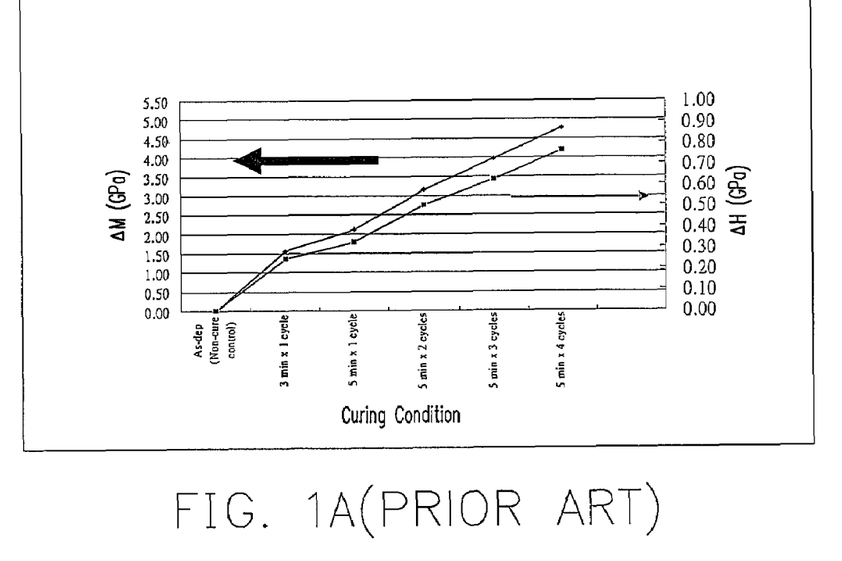
FIGS. 1A-1C show respective variations of increased modulus ($\Delta M$), increased hardness ($\Delta H$), increased dielectric constant ($\Delta K$) and increased stress ($\Delta S$) of a porous low-k material with the UV-curing condition.
Figure 1B:
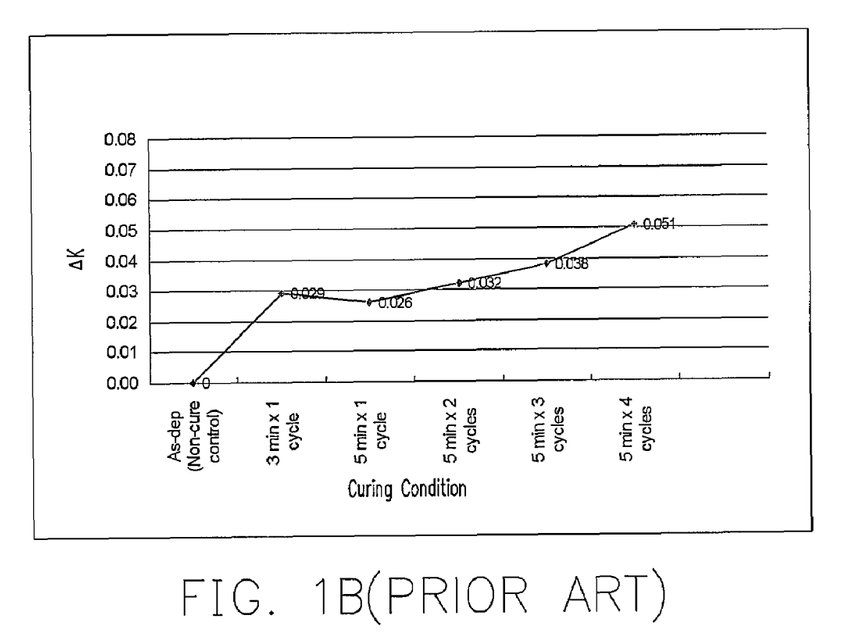
Figure 1C:
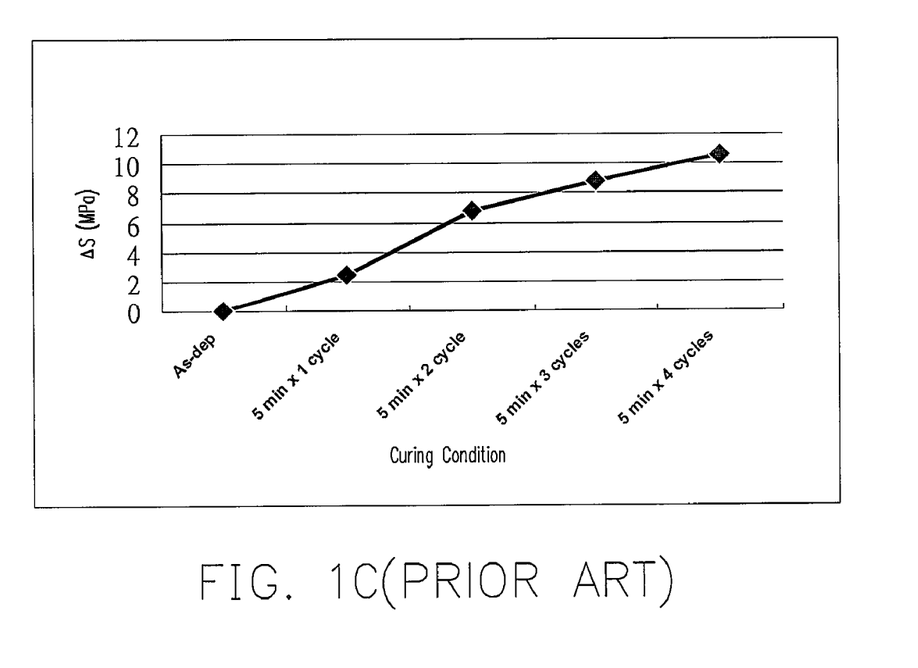

FIGS. 1A-1C show respective variations of increased modulus ($\Delta M$), increased hardness ($\Delta H$), increased dielectric constant ($\Delta K$) and increased stress ($\Delta S$) of a porous low-k material with the UV-curing condition. As shown in the figures, the modulus, hardness, dielectric constant and stress of a porous low-k layer all increase with the number of UV-curing cycles. Accordingly, the physical properties of the porous low-k layers are not uniform in the prior art because the numbers of the UV-curing cycles experienced by them are different.

SUMMARY OF THE INVENTION

In view of the foregoing, this invention provides an interconnect structure to prevent the above-mentioned accumulative effect caused by multiple UV-curing cycles.

This invention also provides a method for fabricating the interconnect structure of this invention.

The interconnect structure of this invention is disposed on a substrate with a conductive part thereon, including a first porous low-k layer on the substrate, a damascene structure in the first porous low-k layer electrically connecting with the conductive part, a second porous low-k layer over the first porous low-k layer and the damascene structure, and a first UV-absorption layer at least between the first and the second porous low-k layers.

The first UV-absorption layer may be further disposed between the damascene structure and the second porous low-k layer. In such cases, an etching stop layer may be further disposed between the first UV-absorption layer and the second porous low-k layer, or disposed on the first porous low-k layer and the damascene structure but under the first UV-absorption layer.

Alternatively, the damascene structure is disposed in the first UV-absorption layer and the first porous low-k layer, while an etching stop layer may be further disposed on the first UV-absorption layer and the damascene structure but under the second porous low-k layer.

The first UV-absorption layer may include a material selected from nitrogen-containing compounds, carbon-containing compounds and oxygen-containing compounds, wherein silicon oxynitride (SiON) is more preferred. The thickness of the first UV-absorption layer may be about 100-1000 Å, and the first UV-absorption layer may be a composite layer. Moreover, when the substrate excluding the conductive part includes a porous low-k material, the interconnect structure may further includes a second UV-absorption layer that is disposed at least between the porous low-k material and the first porous low-k layer.

A method for fabricating an interconnect structure of this invention is described below. A substrate with a conductive part thereon is provided, a first porous low-k layer is formed on the substrate, and then a first UV-curing step is conducted. A damascene structure is formed in the first porous low-k layer to electrically connect with the conductive part, and then a first UV-absorption layer is formed on the first porous low-k layer and the damascene structure. A second porous low-k layer is formed on the first UV-absorption layer, and a second UV-curing step is conducted.

In the above method, an etching stop layer may be further formed on the first UV-absorption layer after the first UV-absorption layer is formed but before the second porous low-k layer is formed, or formed on the first porous low-k layer and the damascene structure after the damascene structure is formed but before the first UV-absorption layer is formed. Moreover, when the substrate excluding the conductive part includes a porous low-k material, a second UV-absorption layer may be further formed over the substrate before the first porous low-k layer is formed, and the damascene structure is later formed further through the second UV-absorption layer to connect the conductive part.

Another method for fabricating an interconnect structure of this invention is described below. A substrate with a conductive part thereon is provided, a first porous low-k layer is formed on the substrate, and then a first UV-curing step is conducted. A first UV-absorption layer is formed on the first porous low-k layer, and a damascene structure is formed in the first UV-absorption layer and the first porous low-k layer to electrically connect with the conductive part. A second porous low-k layer is formed on the first UV-absorption layer and the damascene structure, and a second UV-curing step is conducted.

In the above method, an etching stop layer may be further formed on the first UV-absorption layer and the damascene structure after the damascene structure is formed but before the second porous low-k layer is formed. Moreover, when the substrate excluding the conductive part includes a porous low-k material, the substrate may be provided further with a second UV-absorption layer thereon, wherein the conductive part is formed in the second UV-absorption layer and the substrate.

Since a UV-absorption layer is disposed between two porous low-k layers in this invention, a lower porous low-k layer is protected from UV irradiation in the UV-curing step done to an upper porous low-k layer. Therefore, by applying this invention to an IC structure, the physical properties of a lower porous low-k layer do not vary with the number of UV-curing cycles, so that the uniformity of the physical properties of the porous low-k layers can be improved.

It is to be understood that both the foregoing general description and the following detailed description are exemplary, and are intended to provide further explanation of the invention as claimed.

DESCRIPTION OF THE PREFERRED EMBODIMENTS

In the embodiments of this invention, the substrate excluding the conductive part also includes a porous low-k material and requires a UV-absorption layer for protection. Such a substrate may be an IMD layer in which an interconnect structure has been formed. However, the substrate is not restricted to be a porous low-k material layer, but can be any film with a conductive part thereon.

Figure 2A:
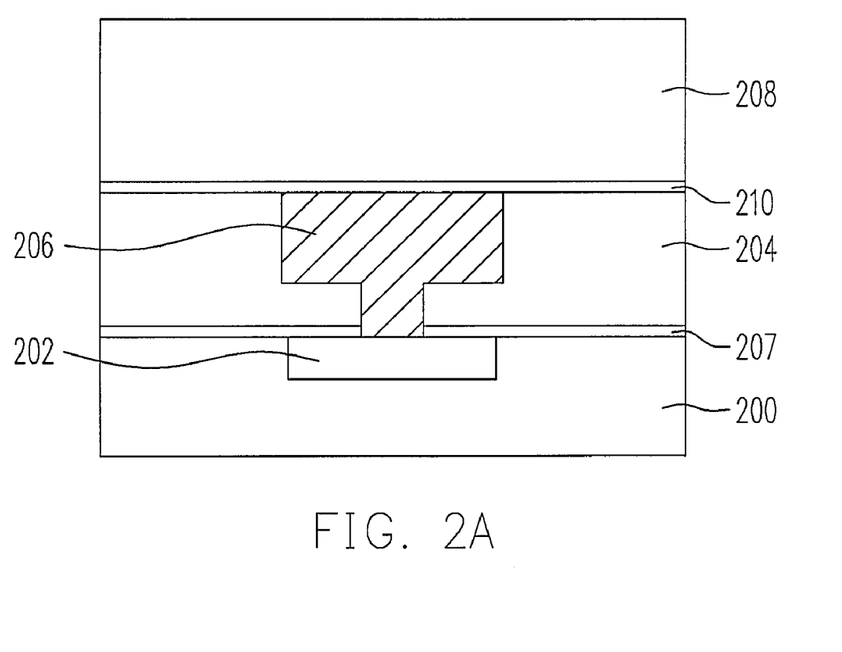
FIGS. 2A-2E illustrate five interconnect structures in a cross-sectional view according to different embodiments of this invention.

FIGS. 2A-2E illustrate five interconnect structures in a cross-sectional view according to different embodiments of this invention. Referring to FIG. 2A first, the substrate 200 has a conductive part 202 thereon, which may be a conductive line. A porous low-k layer 204 is disposed on the substrate 200. A damascene structure 206 like a dual-damascene structure is disposed in the porous low-k layer 204 electrically connecting with the conductive part 202, wherein the damascene structure 206 may include metal. A UV-absorption layer 207 is disposed between the substrate 200 and the porous low-k layer 204.

Referring to FIG. 2A again, a UV-absorption layer 210 is disposed on the porous low-k layers 204 and the damascene structure 206, and another porous low-k layer 208 is disposed on the UV-absorption layer 210. The UV-absorption layer 207 or 210 may include a material selected from nitrogen-containing compounds, carbon-containing compounds and oxygen-containing compounds, wherein SiON is more preferred. The thickness of the UV-absorption layer 207 or 210 is preferably about 100-1000 Å.

It is noted that during the UV-curing step of the upper porous low-k layer 208, the UV-absorption layer 210 can absorb the UV light passing the porous low-k layer 208 to prevent the lower porous low-k layer 204 from being further cured. Thereby, the uniformity of the physical properties of the porous low-k layers is improved.

Figure 2B:
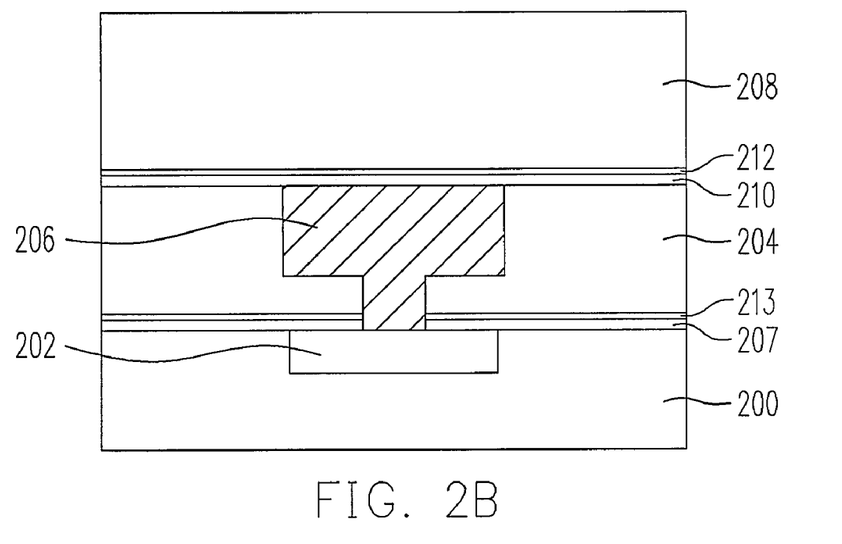
Figure 2C:
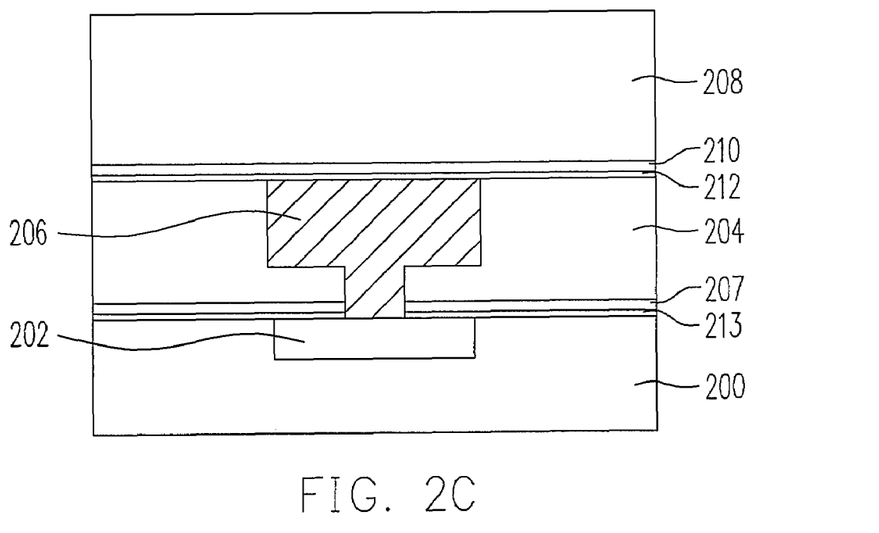

Referring to FIG. 2B, in another embodiment, an etching stop layer 212 is further disposed between the UV-absorption layer 210 and the porous low-k layer 208, and another etching stop layer 213 is further disposed between the UV-absorption layer 207 and the porous low-k layer 204, wherein the etching stop layer 212 or 213 may be an SiN layer. Alternatively, as shown in FIG. 2C, the etching stop layer 212 is on the porous low-k layer 204 and the damascene structure 206 but under the UV-absorption layer 210, and the etching stop layer 213 is disposed on the substrate 200 but under the UV-absorption layer 207.

Figure 2D:
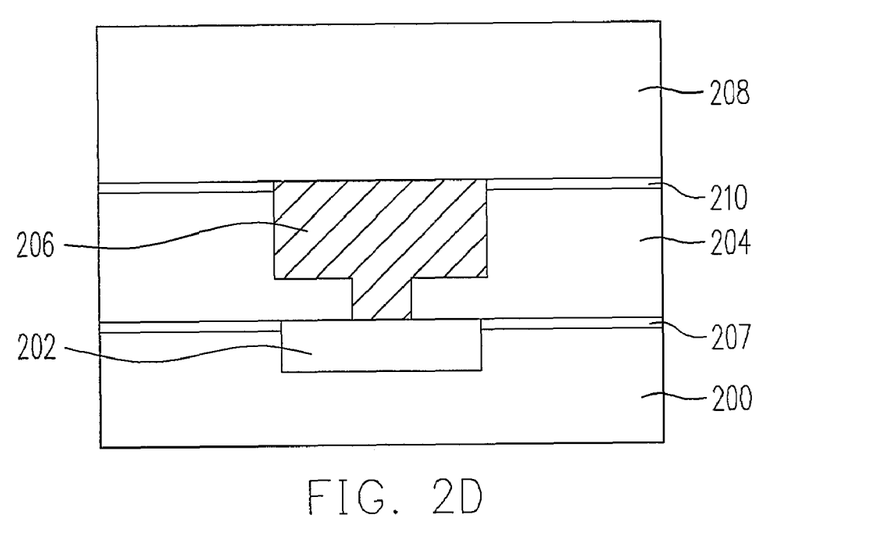
Figure 2E:
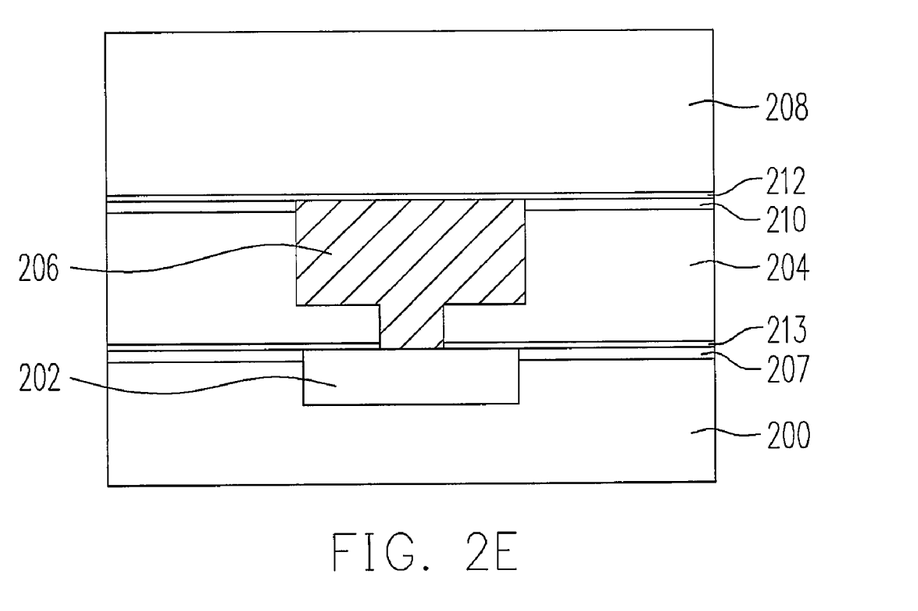

Referring to FIG. 2D, in still another embodiment, the interconnect structure is different from the above mainly in that the conductive part 202 is disposed in the UV-absorption layer 207 and the substrate 200, and the damascene structure 206 is disposed in the UV-absorption layer 210 and the porous low-k layer 204 to electrically connect with the conductive part 202. Similarly, as shown in FIG. 2E, an etching stop layer 213 may be further disposed on the UV-absorption layer 207 and the conductive part 202 but under the porous low-k layer 204, and an etching stop layer 212 may be further disposed on the UV-absorption layer 210 and the damascene structure 206 but under the porous low-k layer 208.

It is also noted that the UV-absorption layer 207 or 210 in any embodiment may be a composite layer, which includes more than one films with different UV-absorption coefficients to have higher UV-absorptivity.

Figure 3A:
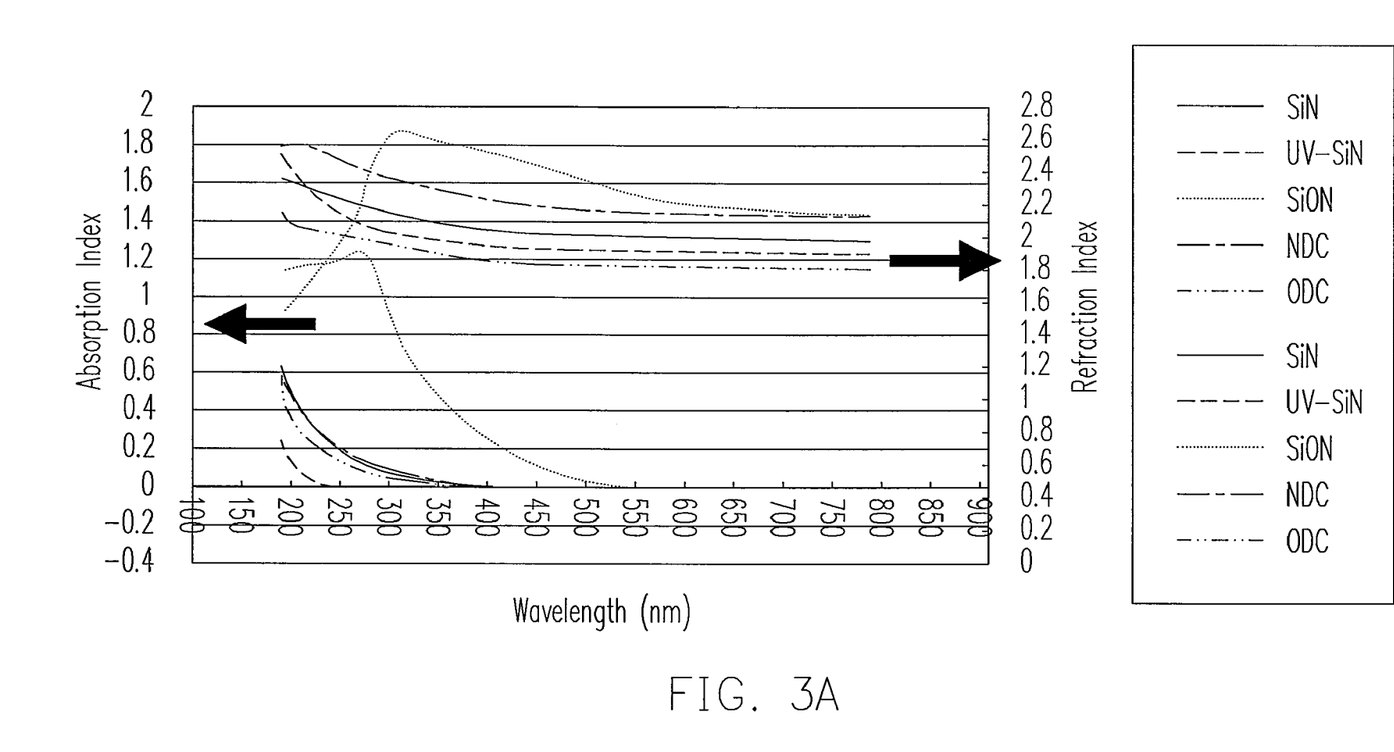
FIGS. 3A and 3B show respective variations of absorption index, refraction index and reflectivity of different UV-absorption materials with the wavelength of light.

FIG. 3A plots the variations of absorption index and refraction index of different UV-absorption materials with the wavelength of light, wherein five materials including SiN, UV-treated SiN, SiON, nitrogen-doped carbide (NDC) and oxygen-doped carbide (ODC) were tested for their absorption and refraction indexes at different wavelengths. As shown in FIG. 3A, SiON is the highest in the absorption index and refraction index at 300-400 nm, and is therefore a preferred material for the UV-absorption layer.

Figure 3B:
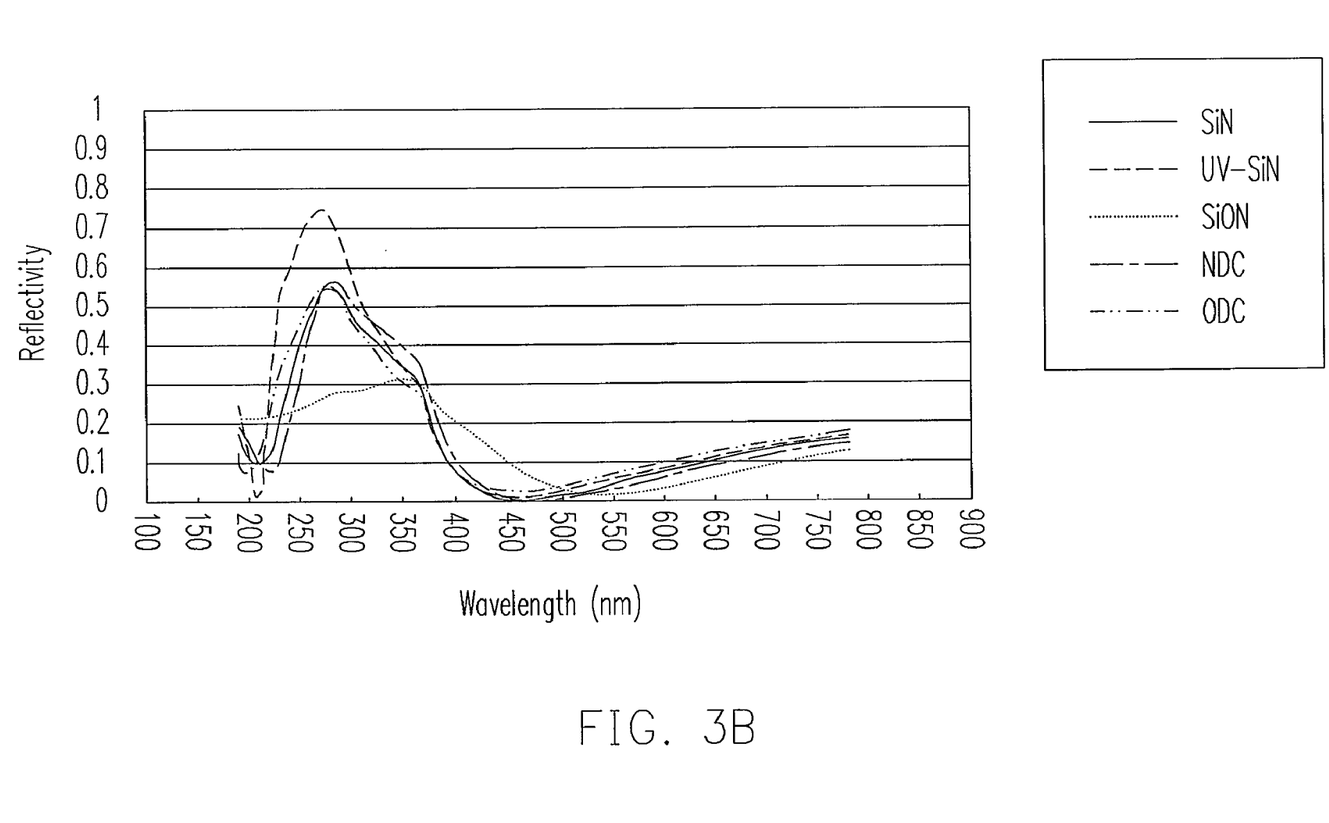

FIG. 3B plots the variations of reflectivity of the above five UV-absorption materials, SiN, UV-SiN, SiON, NDC and ODC, with light wavelength. As shown in FIG. 3B, SiON is the lowest in the reflectivity at 300-400 nm, which also indicates that SiON is a preferred material for the UV-absorption layer.

Figure 4A:
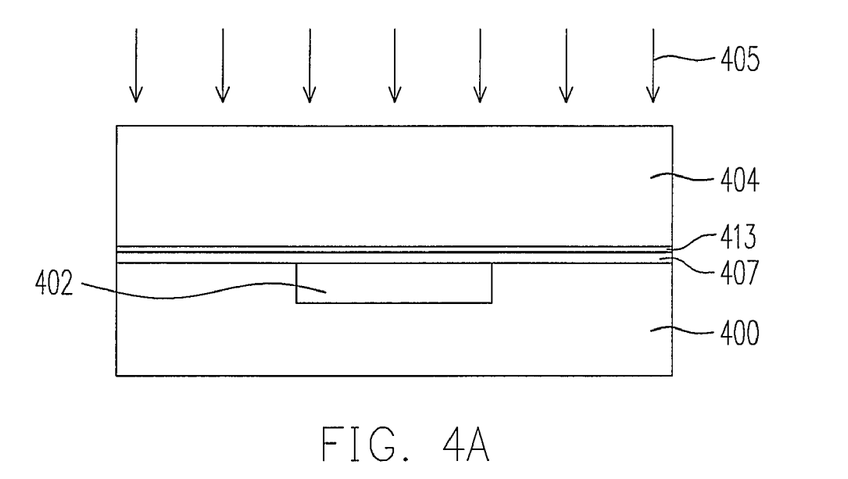
FIGS. 4A-4B illustrate a process flow of fabricating an interconnect structure according to a preferred embodiment of this invention.

FIGS. 4A-4B illustrate a process flow of fabricating an interconnect structure according to the preferred embodiment of this invention. Referring to FIG. 4A, a substrate 400 with a conductive part 402 thereon is provided, wherein the conductive part 402 may be a conductive line. A UV-absorption layer 407 and an etching stop layer 413 are sequentially formed on the substrate 400, and a porous low-k layer 404 is formed on the etching stop layer 413. A UV-curing step 405 is then conducted to the porous low-k layer 404.

Figure 4B:
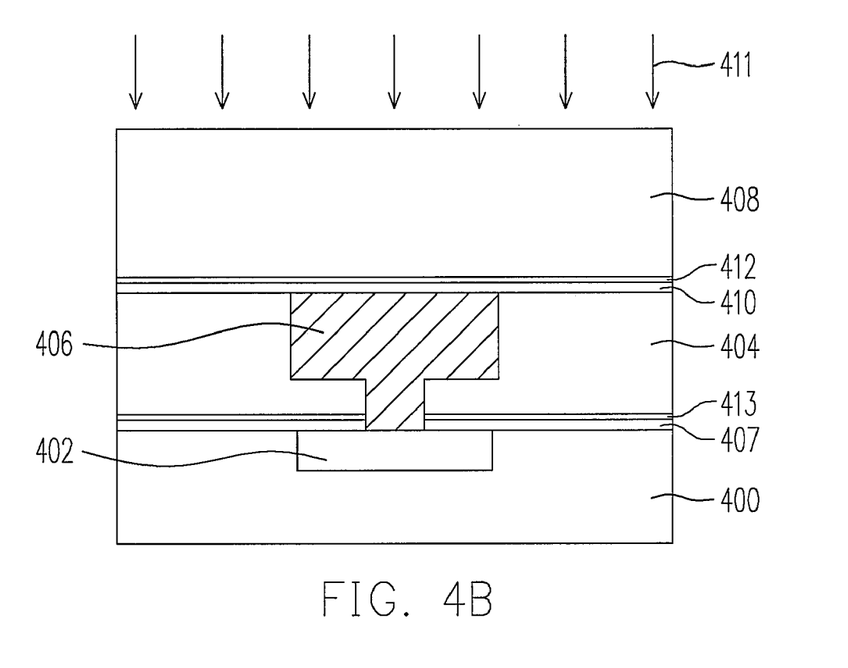

Referring to FIG. 4B, a damascene structure 406 is then formed in the porous low-k layer 404 to electrically connect with the conductive part 402. A UV-absorption layer 410 is formed on the porous dielectric layer 404 and the damascene structure 406. Then, an etching stop layer 412 and a porous low-k layer 408 are sequentially formed on the UV-absorption layer 410, and another UV-curing step 411 is conducted to the porous low-k layer 408.

Alternatively, in another embodiment, the etching stop layer 413 is formed on the substrate 400 before the UV-absorption layer 407 is formed, and the etching stop layer 412 is formed on the porous low-k layer 404 and the damascene structure 406 before the UV-absorption layer 410 is formed.

It is noted that since a UV-absorption layer 410 is formed on the porous low-k layer 404, the UV light passing the porous low-k layer 408 is absorbed by the UV-absorption layer 410 during the UV-curing of the porous low-k layer 408. Therefore, the porous low-k layer 404 is not cured again by the UV light. Accordingly, by applying the above process to the fabrication of multi-level interconnect structure, it is possible to improve the uniformity of the physical properties of porous low-k layers at different levels.

On the other hand, to form the structure of FIG. 2D or 2E, the damascene structure 206 is formed in the UV-absorption layer 210 and the porous low-k layer 204 after the UV-absorption layer 210 is formed, and the conductive part 202 is formed in the UV-absorption layer 207 and the substrate 200 after the UV-absorption layer 207 is formed. In addition, as shown in FIG. 2E, an etching stop layer 212 may be further formed on the UV-absorption layer 210 and the damascene structure 206 after the damascene structure 206 is formed, and another etching stop layer 213 may be further formed on the UV-absorption layer 207 and the conductive part 202 after the conductive part 202 is formed.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating an interconnect structure, comprising:
    providing a substrate having a conductive part thereon;
    forming a first porous low-k layer over the substrate;
    conducting a first UV-curing step;
    forming a damascene structure in the first porous low-k layer to electrically connect with the conductive part on the substrate;
    forming a first UV-absorption layer on the first porous low-k layer and the damascene structure;
    forming a second porous low-k layer on the first UV-absorption layer; and
    conducting a second UV-curing step.

2. The method of claim 1, further comprising a step of forming an etching stop layer on the first UV-absorption layer after the first UV-absorption layer is formed but before the second porous low-k layer is formed.

3. The method of claim 1, further comprising a step of forming an etching stop layer on the first porous low-k layer and the damascene structure after the damascene structure is formed but before the first UV-absorption layer is formed.

4. The method of claim 1, wherein the first UV-absorption layer comprises a material selected from nitrogen-containing compounds, carbon-containing compounds and oxygen-containing compounds.

5. The method of claim 1, wherein the substrate excluding the conductive part comprises a porous low-k material, further comprising:
    forming a second UV-absorption layer on the substrate before the first porous low-k layer is formed; and
    forming the damascene structure further through the second UV-absorption layer to connect the conductive part in the step of forming the damascene structure.

6. A method for fabricating an interconnect structure, comprising:
    providing a substrate having a conductive part thereon;
    forming a first porous low-k layer over the substrate;
    conducting a first UV-curing step;
    forming a first UV-absorption layer on the first porous low-k layer;
    forming a damascene structure in the first UV-absorption layer and the first porous low-k layer to electrically connect with the conductive part on the substrate;
    forming a second porous low-k layer on the first UV-absorption layer and the damascene structure; and
    conducting a second UV-curing step.

7. The method of claim 6, further comprising a step of forming an etching stop layer on the first UV-absorption layer and the damascene structure after the damascene structure is formed but before the second porous low-k layer is formed.

8. The method of claim 6, wherein the first UV-absorption layer comprises a material selected from nitrogen-containing compounds, carbon-containing compounds and oxygen-containing compounds.

9. The method of claim 6, wherein
    the substrate excluding the conductive part comprises a porous low-k material;
    the substrate has been formed with a second UV-absorption layer thereon; and
    the conductive part is formed through the second UV-absorption layer.

* * * * *